(12) United States Patent
Li et al.

(10) Patent No.: US 7,432,148 B2
(45) Date of Patent: Oct. 7, 2008

(54) SHALLOW TRENCH ISOLATION BY ATOMIC-LEVEL SILICON RECONSTRUCTION

(75) Inventors: Jiutao Li, Boise, ID (US); Ralph Kauffman, Boise, ID (US); Richard A. Mauritzson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/214,931

(22) Filed: Aug. 31, 2005

(65) Prior Publication Data

US 2007/0048927 A1    Mar. 1, 2007

(51) Int. Cl.
*H01L 21/8238* (2006.01)
*H01L 21/76* (2006.01)
*H01L 21/20* (2006.01)
*H01L 21/336* (2006.01)

(52) U.S. Cl. .................. 438/218; 438/221; 438/424; 438/433; 438/435; 438/758; 438/386; 438/296; 257/622; 257/77; 257/E21.546

(58) Field of Classification Search .................. 438/218, 438/221, 424, 433, 435, 386, 296, 758; 257/622, 257/77, E21.546
See application file for complete search history.

(56) References Cited

U.S. PATENT DOCUMENTS

| | | | | |
|---|---|---|---|---|
| 5,573,973 A | * | 11/1996 | Sethi et al. | 438/386 |
| 6,333,598 B1 | * | 12/2001 | Hsu et al. | 313/495 |
| 6,495,424 B2 | * | 12/2002 | Kunikiyo | 438/296 |
| 6,660,613 B2 | * | 12/2003 | Kim et al. | 438/424 |
| 6,979,878 B1 | * | 12/2005 | Gardner et al. | 257/510 |
| 2004/0014296 A1 | * | 1/2004 | Kwak et al. | 438/424 |

OTHER PUBLICATIONS

H.K. Kwon et al., IEEE Trans. Electron Devices, vol. 51, 178 (2004).
J. Nara et al., Phys. Rev. Lett. 79, 4421 (1997).

* cited by examiner

*Primary Examiner*—Michael S. Lebentritt
*Assistant Examiner*—Mohsen Ahmadi
(74) *Attorney, Agent, or Firm*—Dickstein Shapiro LLP (57) ABSTRACT

Methods of forming an improved shallow trench isolation (STI) region are disclosed. Several exemplary techniques are proposed for treating STI sidewalls to improve the silicon (Si) surface at the atomic level. Each of the exemplary methods creates a smooth STI sidewall surface, prior to performing oxidation, by reconstructing silicon atoms at the surface. The suggested STI region can be used in imager pixel cells or memory device applications.

30 Claims, 8 Drawing Sheets

SHALLOW TRENCH ISOLATION BY ATOMIC-LEVEL SILICON RECONSTRUCTION

FIELD OF THE INVENTION

The present invention relates generally to semiconductor devices, and more particularly, to shallow trench isolation technology for use in semiconductor devices, including image sensors and memory devices.

BACKGROUND OF THE INVENTION

CMOS image sensors are increasingly being used as low cost imaging devices. A CMOS image sensor circuit includes a focal plane array of pixel cells, each one of the cells includes a photogate, photoconductor, or photodiode having an associated charge accumulation region within a substrate for accumulating photo-generated charge. Each pixel cell may include a transistor for transferring charge from the charge accumulation region to a sensing node and a transistor for resetting the sensing node to a predetermined charge level prior to charge transference. The pixel cell may also include a source follower transistor for receiving and amplifying charge from the sensing node and an access transistor for controlling the readout of the cell contents from the source follower transistor.

In a CMOS image sensor, the active elements of a pixel cell perform the necessary functions of: (1) photon to charge conversion; (2) accumulation of image charge; (3) transfer of charge to the sensing node accompanied by charge amplification; (4) resetting the sensing node to a known state; (5) selection of a pixel for readout; and (6) output and amplification of a signal representing pixel charge from the sensing node.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994). See also U.S. Pat. Nos. 6,177,333 and 6,204,524, which describe the operation of conventional CMOS image sensors and are assigned to Micron Technology, Inc., the contents of which are incorporated herein by reference.

Figure 1:
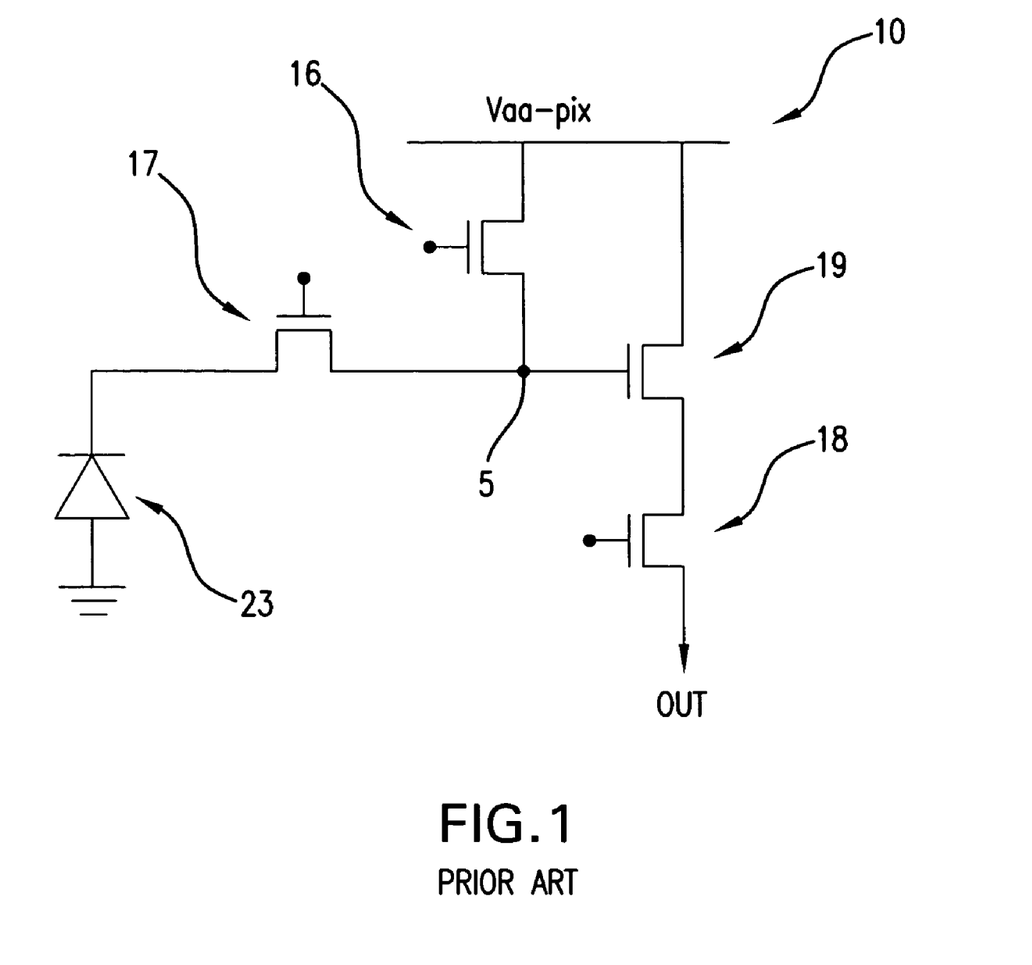
FIG. 1 is an electrical schematic diagram of a conventional pixel cell.

A schematic diagram of a conventional four transistor (4T) CMOS pixel cell 10 is shown in FIG. 1. The CMOS pixel cell 10 generally comprises a photo-conversion device 23 for generating and collecting charge generated by light incident on the pixel cell 10, and a transfer transistor 17 for transferring photoelectric charges from the photo-conversion device 23 to a sensing node, typically a floating diffusion region 5. The floating diffusion region 5 is electrically connected to the gate of an output source follower transistor 19. The pixel cell 10 also includes a reset transistor 16 for resetting the floating diffusion region 5 to a predetermined voltage $V_{aa\text{-}pix}$; and a row select transistor 18 for outputting a signal from the source follower transistor 19 to an output terminal in response to an address signal.

Figure 2:
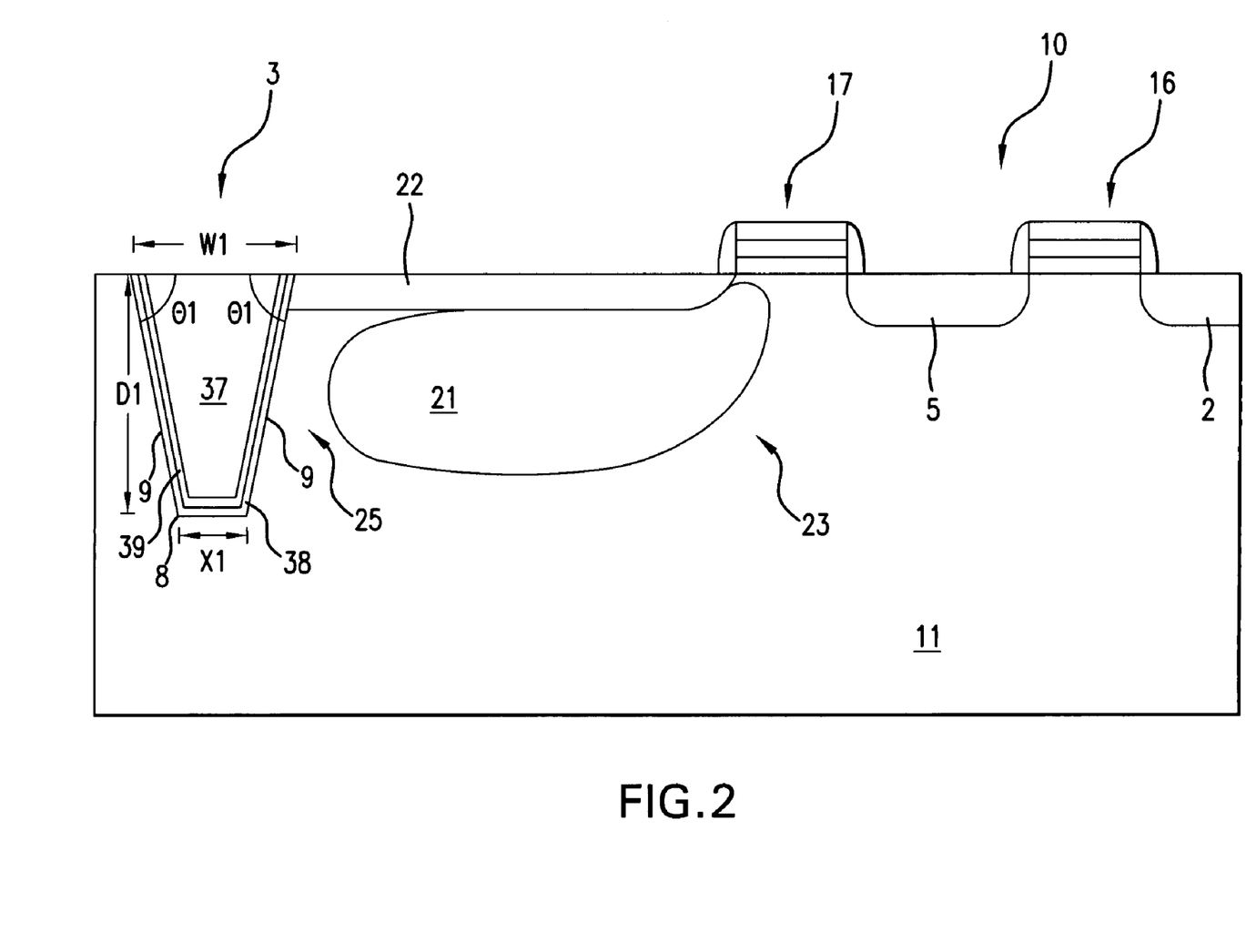
FIG. 2 is a cross-sectional view of a conventional pixel cell.

FIG. 2 is a cross-sectional view of a portion of the pixel cell 10 of FIG. 1 showing the photo-conversion device 23, transfer transistor 17 and reset transistor 16. The exemplary photo-conversion device 23 may be formed as a pinned photodiode as shown. The photodiode has a p-n-p construction comprising a p-type surface layer 22 and an n-type photodiode region 21 within a p-type substrate 11. The photodiode photo-conversion device 23 is adjacent to and partially underneath the transfer transistor 17. The reset transistor 16 is on a side of the transfer transistor 17 opposite the photo-conversion device 23. As shown in FIG. 2, the reset transistor 16 includes a source/drain region 2. The floating diffusion region 5 is located between the transfer and reset transistors 17, 16.

In the CMOS pixel cell 10 depicted in FIGS. 1 and 2, electrons are generated by light incident on the photo-conversion device 23 and are stored in the n-type photodiode region 21. These charges are transferred to the floating diffusion region 5 by the transfer transistor 17 when the transfer transistor 17 is activated. The source follower transistor 19 produces an output signal based on the transferred charges applied to its gate. A maximum output signal is proportional to the number of electrons extracted from the n-type photodiode region 21.

A shallow trench isolation (STI) region 3 can be formed adjacent to an active element, such as the n-type charge accumulation region 21, and it is used to isolate the pixel cell 10 from other pixel cells and devices of the image sensor. The STI region 3 is typically formed using a conventional STI process. The STI region 3 is typically lined with an oxide liner 38 and filled with a dielectric material 37. Also, the STI region 3 can include a nitride liner 39. The nitride liner 39 provides several benefits, including improved corner rounding near the STI region 3 corners, reduced stress adjacent the STI region 3, and reduced leakage.

During conventional STI-forming processes, a trench is formed to a depth D1 between about 1000 Angstroms (Å) and about 6000 Å. The sidewalls 9 of the trench are formed at an angle θ1, which is typically between 80 degrees and 90 degrees.

A common problem associated with the above described STI region 3 is dangling bonds (e.g., dangling silicon (Si—) bonds 231 (FIG. 4A)) at the surface of the substrate 11 and along the trench bottom 8 and sidewalls 9. The dangling bonds 231 (FIG. 4A) create an uneven surface and may also cause a high density of trap sites along the trench bottom 8 and sidewalls 9. As a result of these trap sites formed along the bottom 8 and sidewalls 9 of the STI region 3, current generation near and along the trench bottom 8 and sidewalls 9 can be significant. Current generated from trap sites inside or near the photo-conversion device's 23 depletion region causes undesired dark current and increased fixed pattern noise.

Further, as the size of pixel cells continues to decrease, due to desired scaling, the impact of the uneven silicon surface of the STI sidewalls becomes more pronounced and dark current generated from the STI regions increases. Effective isolation in scaled pixel cells is increasingly important as pixels cells are being made smaller, but this isolation needs to be done without decreasing the quantum efficiency of the pixel cell or increasing the dark current near the STI region.

Figure 3:
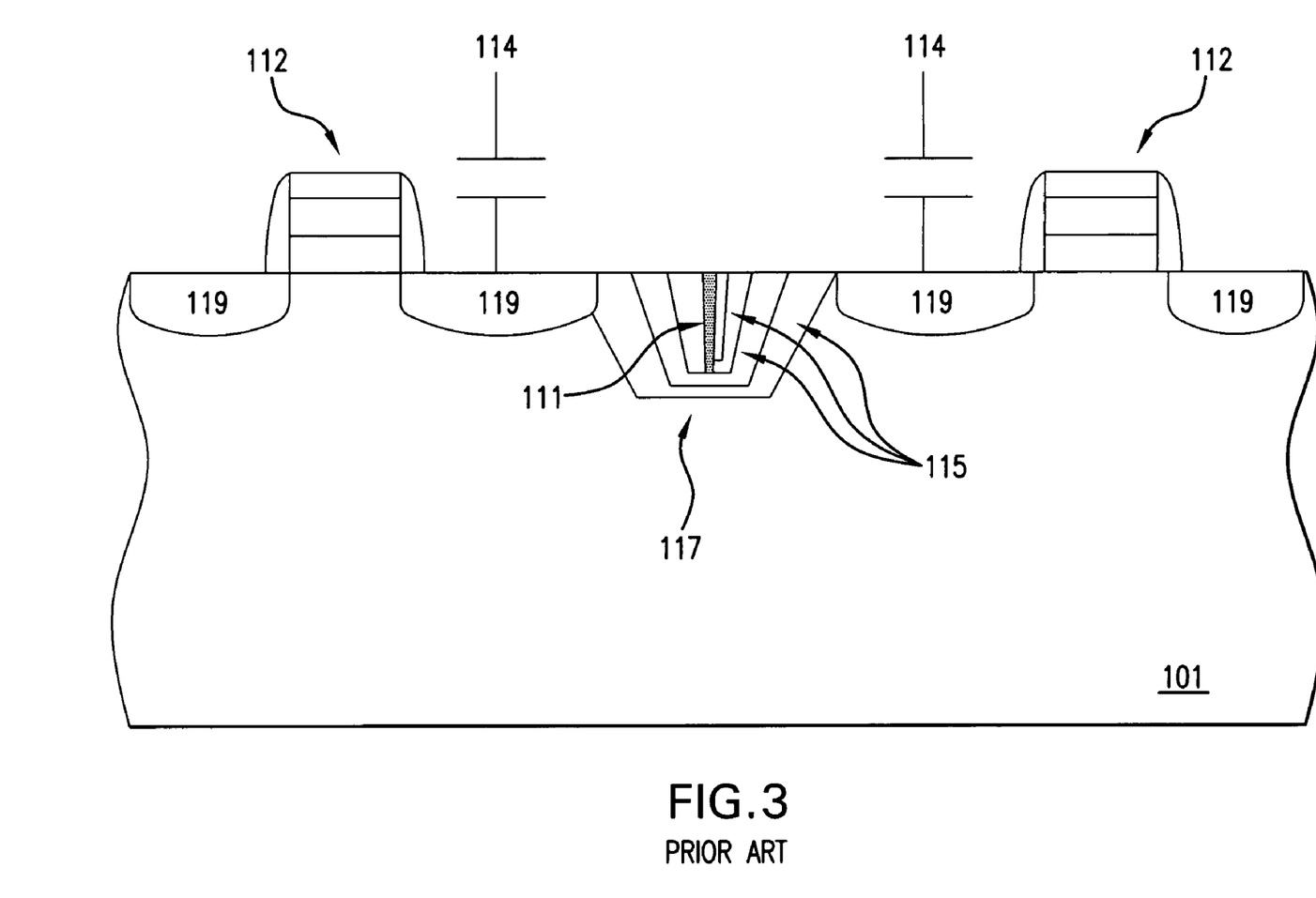
FIG. 3 is a cross-sectional view of portions of two conventional memory cells.

Similarly, high quality isolation techniques are also important in fabricating memory and other integrated circuit devices. STI is a conventional technique used, for example, in isolating conventional memory cells, such as dynamic random access memory (DRAM) cells, portions of which are shown in FIG. 3. Referring to FIG. 3, deeper STI regions 117 have been found to provide better isolation between portions of memory cells 112 such as between capacitors 114 and active regions 119 in a substrate 101; however, there is a limit to how deep the STI region 117 can be made in the substrate 101. If the STI region 117 is too deep, filling the STI trench with oxide layers 115 will result in voids 111 or cracks in the trench. Thus, there is a desire and need to isolate active areas of memory devices without relying on a deep or heavily doped trench region.

Accordingly, it is desirable to have an improved isolation structure for reducing dark current while maintaining high quantum efficiency for imager pixel cells. Simple methods of forming the improved isolation structure are also needed. In addition, there is needed an effective isolation technique which can also be used in high density integrated circuit applications, including within DRAM memory devices.

BRIEF SUMMARY OF THE INVENTION

In various exemplary embodiments, the present invention relates to methods of forming an improved shallow trench isolation (STI) region. More specifically, several exemplary techniques are proposed for treating STI sidewalls to improve the silicon (Si) surface at the atomic level. The invention serves to smooth the STI sidewall surface by performing silicon reconstruction according to several exemplary methods, prior to performing oxidation of the STI region.

In one aspect, the invention provides an improved STI region for isolating structures in an imager pixel cell. In accordance with another aspect, the invention provides an improved STI region for isolating structures in a memory device and other integrated circuit devices.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF THE INVENTION

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as including silicon, silicon-on-insulator (SOI), silicon-on-sapphire (SOS), and silicon-on-nothing (SON) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based, for example, on silicon-germanium which would face similar problems at the atomic level as the silicon-based substrates discussed herein.

The term "pixel" or "pixel cell" refers to a picture element unit cell containing a photo-conversion device and transistors for converting electromagnetic radiation to an electrical signal. For purposes of illustration, a portion of a representative pixel cell is illustrated in the figures and description herein, however, the invention is in no way limited to use with the illustrated pixel cell. Finally, the phrase "substantially vertical" should be understood to include not only lines and planes that are exactly vertical (i.e., at a 90° angle) with respect to a reference point, but also includes lines or planes that are within a small amount of variance, such as within about 2°, of being exactly vertical with respect to some reference line or plane.

Figure 4:
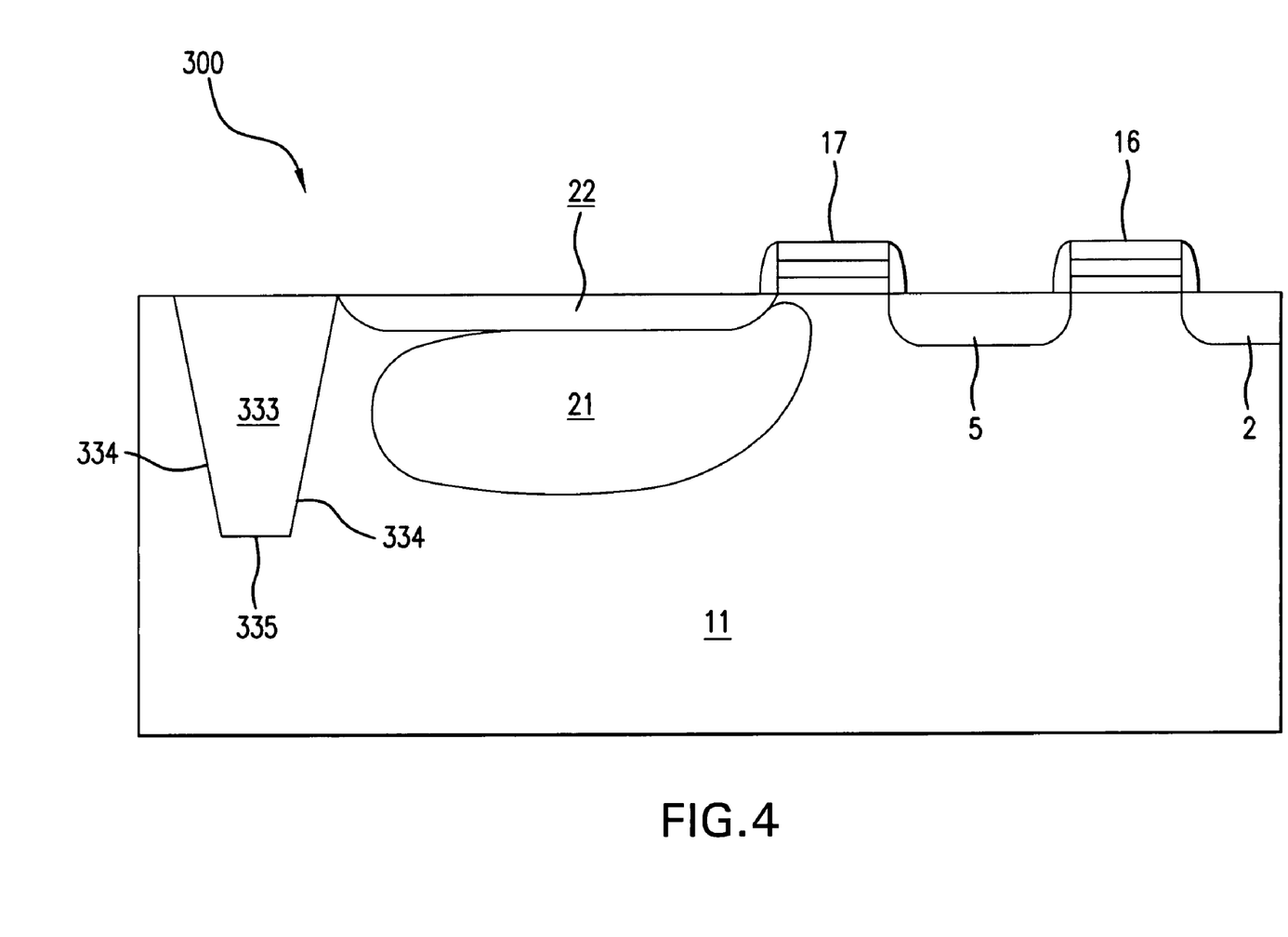
FIG. 4 is a cross-sectional view illustrating an isolation region according to exemplary embodiments of the invention.

Now turning to the figures, where like numerals represent like elements, FIG. 4 illustrates a cross-sectional view of a pixel cell 300 according to an exemplary embodiment of the invention. The pixel cell 300 is similar to the pixel cell 10 depicted in FIGS. 1 and 2, except that the pixel cell 300 includes an improved trench isolation region 333, rather than the conventional STI region 3 (FIG. 2), formed in accordance with the exemplary methods described below.

It should be understood that although the STI region 333 is shown in connection with a four transistor (4T) CMOS pixel cell 300, the invention is not limited to application with the illustrated pixel cell 300. It should also be understood that although the exemplary structures and methods discussed below are described with reference to the imager pixel cell 300, that the STI region 333 can be used in numerous other integrated circuit (IC) semiconductor devices, including but not limited to, memory devices. Accordingly, unless otherwise specifically mentioned, the exemplary processes of forming STI region 333 is the same whether used in a memory or other IC device or in a pixel cell 300.

The improved isolation region 333 can be formed in accordance with several exemplary methods, as now described. The purpose of each of these methods is to form smooth sidewalls, by eliminating the surface roughness caused at the atomic level by dangling silicon (Si) bonds, prior to oxidation of the trench. For example, the surface can be reconstructed by removal of the dangling Si bonds or by affecting a recombination of the dangling bonds. Accordingly, with reference to FIG. 4A, each of the exemplary processes begins by etching a trench 233 in the area where the STI region 333 is to be formed. Up to this point, the trench 233 may be formed by an process known in the art. In addition, for purposes of simplification of the figures, other portions of the device employing STI region 333 (such as the pixel cell 300), that are not necessary in describing the exemplary methods, have been left out of FIG. 4A.

Figure 4A:
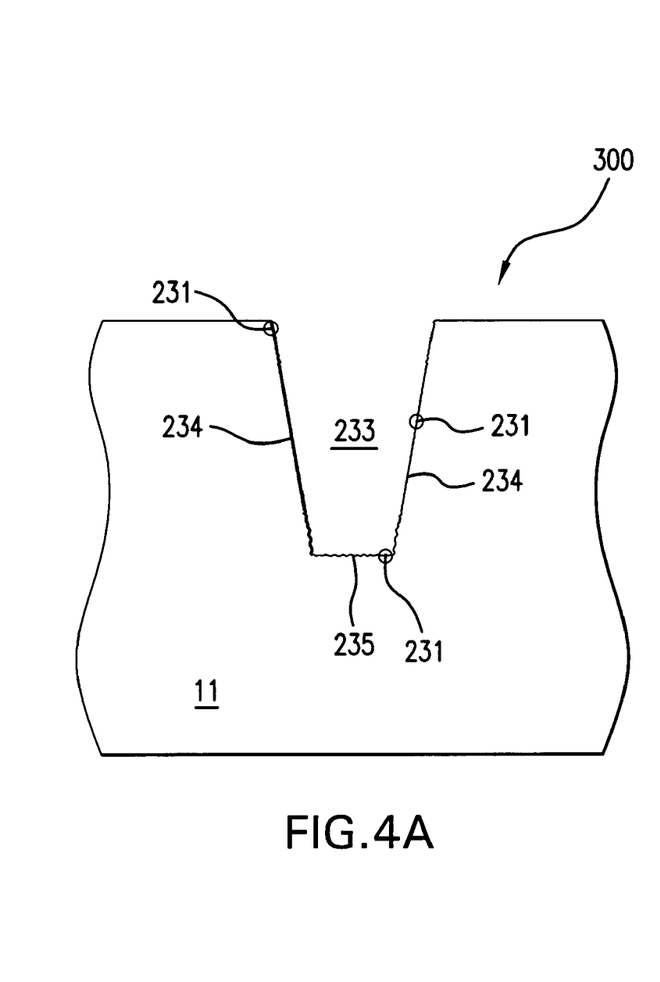
FIG. 4A is a cross-sectional view of an isolation region during a stage of fabrication according to several exemplary embodiments of the invention.

As can been seen, the trench 233 has rough-surfaced sidewalls 234 and a bottom 235, caused by dangling silicon (Si) atoms 231 left exposed when the silicon substrate 11 is etched. The trench 233 can be formed using known methods for trench formation, including but not limited to, dry etching the silicon substrate 11, to a depth of about 1000 to about 6000 Angstroms (Å) deep.

In accordance with a first exemplary STI reconstruction technique of the invention, a noble gas environment anneal is performed on the STI trench 233. A furnace system can be used to reconstruct the STI trench sidewall 234 surface. The anneal temperature should be adjusted to only allow silicon (Si) atomic reconstruction, while maintaining it under the melting point for silicon, which is about 1410° C. A proper temperature for this process may be within the range of about 1000° to about 1100° C. As discussed in greater detail below, for each of these exemplary methods, the STI region (FIG. 4) can be completed using known techniques.

In accordance with a second exemplary STI reconstruction technique in accordance with the invention, a hydrogen gas (H2) environment anneal is performed on the STI trench 233 prior to the oxidation process. Silicon (Si) atom diffusion could be enhanced by hydrogen on a silicon surface. Due to the higher mobility of silicon atoms in the hydrogen gas environment, lower temperature can be used for atomic-level STI trench sidewall 234 reconstruction. An appropriate temperature for performing this step is within the range of about 850° C. to about 1000° C. The working pressure may be maintained in the range of 0.1 to about 100 Torr.

Figure 5:
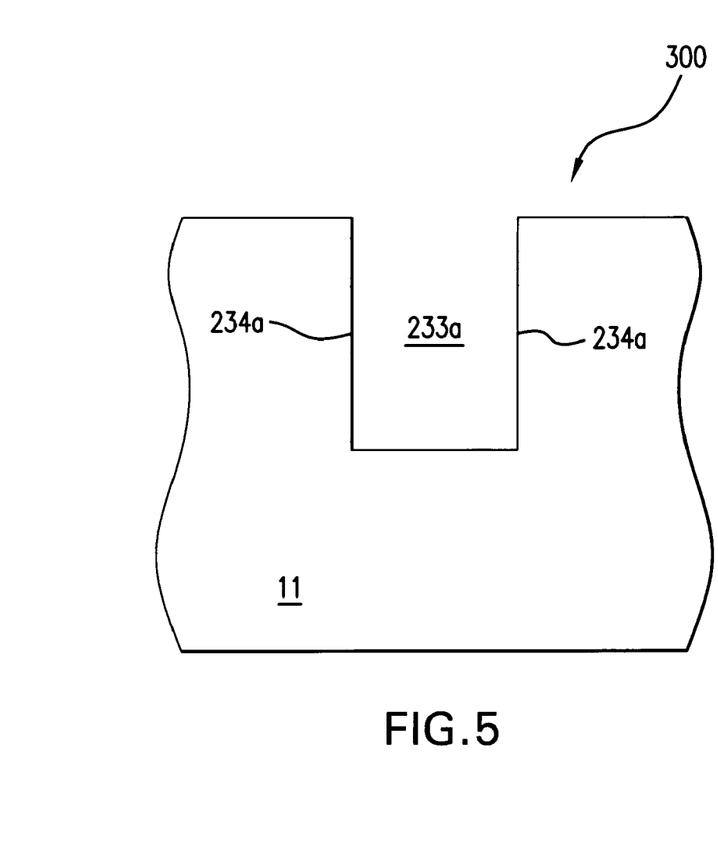
FIG. 5 is a cross-sectional view of an isolation region during a stage of fabrication according to one exemplary embodiment of the invention.

In accordance with a third exemplary STI reconstruction technique of the invention, an anisotropic dry etch is performed on the STI trench 233. In this embodiment, an anisotropic dry etch step can also be used to form the STI trench 233a, or alternatively, the trench 233 can be formed using other techniques, and subsequently, an anisotropic dry etch step can be performed on the trench 233.

As shown in FIG. 5, the anisotropic dry etch step is used to create an STI trench 233a having substantially vertical sidewalls 234a, rather than the conventional sloped sidewalls 234. Numerous etch parameters can be used in accordance with the invention to create the STI trench 233a in a desired shape. For example, parameters such as the etch pressure, substrate bias, and etch chemicals can be changed as desired. Any combination of parameters and materials may be used to create the substantially vertical sidewalls 234a as shown in FIG. 5. It should further be understood that conventional STI oxidation techniques, such as high density plasma (HDP) oxidation, may have fill problems with the STI trench 233a having substantially vertical sidewalls 234a. Accordingly, alternative techniques such as a flowable oxide process, using for example, a spin-on deposition method, can be used when filling the STI trench 233a with dielectric layers.

In accordance with a fourth exemplary STI recombination technique of the invention, a high temperature field emission step is performed on the STI trench 233 (FIG. 4). In a vacuum system, the silicon substrate 11 can be biased by applying a high voltage near or in the trench 233 area. In accordance with a preferred embodiment, the system is maintained at a pressure of less than about $1e^{-8}$ Torr, although a pressure of less than about $1e^{-6}$ Torr may be suitable. For practical reasons, several thousand Volts of electrical potential could be applied to the silicon substrate 11. The electrical force generated at the protruded silicon surface is high enough to pull the silicon atoms 231 out of the surface. This force thus smoothes the silicon surface in the area of the STI trench sidewalls 234. A higher substrate temperature, preferably in the range of about 800° to about 1000° C., can increase the effectiveness of this electric field emission.

In accordance with a fifth exemplary STI recombination technique of the invention, a gentle argon (Ar) gas sputtering and anneal cycle is performed on the STI trench 233. An argon sputtering step is followed by a high temperature anneal in the area of the STI trench sidewalls 234 and bottom 235 to create a smooth surface in these areas. A low argon beam density, having beam current characteristics within the range of about 300 eV to about 800 eV (preferably 500 eV) and at about 1 mA/cm², is preferred. A sputter rate may be about 310 Å/min, however, better control is obtained by lowering the sputter rate to less than 10 Å/min. The working pressure for this step can be anywhere in the range of 1 mT to about 1 Torr depending on the other selected parameters. In order to maintain STI critical dimension (CD) control, the total sputtering amount of silicon atoms needs to be less than the STI critical dimension variation for the STI region 333.

Next, after the argon sputtering, a high temperature anneal can be performed at a temperature within the range of about 1000° C. to about 1100° C., although any temperature below the silicon melting point (approximately 1410° C.) may be suitable for performing this step. The argon sputtering and high temperature anneal steps may be repeated in a cycle. The repetition should improve the smoothness of the sidewalls 334 by recombining more silicon (Si) atoms each time the cycle is performed, however, this repetition disadvantageously can increase the overall process costs.

The result of the first through fifth exemplary processes, as shown in FIG. 4 is a STI trench 333 having smooth sidewalls 334 and bottom 335, although as discussed above with regard to FIG. 5, the third exemplary process will create sidewalls 233a which are substantially vertical and smooth. Next, the STI trench 333 can be filled with a dielectric material as desired. Known techniques for filling STI trenches, including but not limited to, lining the trench 233 (FIG. 4A) with a nitride layer and subsequently depositing or growing oxide layers, may be used to form the isolation region 333. Any conventional materials compatible with the implementing device characteristics may be used.

The resulting structure, as shown in FIG. 4, is an STI region 333 that can be used in imager pixel cells or memory device applications. In imager pixel cells, the STI region 333 will decrease the undesirable dark current experienced by the pixel cell 300. Not only will this increase the imaging quality of the pixel cell, but it will also allow a photosensor to be formed very near to the sidewalls of the STI region. This, in turn, increases the quantum efficiency of the pixel cell as less non-photosensitive substrate area is needed.

In memory device applications, the STI region 333 can be used to isolate individual memory cells or memory cell elements from one another. For example, with reference to FIG. 3, the STI region can be formed in accordance with any of the embodiments described above as to replace the conventional STI region 117 isolating at least one active area in a DRAM cell from an adjacent cell's active area(s). In these memory device applications, the improved STI region 333 will increase the refresh ability of the memory device. The STI region of the invention may be more generally used to isolate any desired structure in an integrated circuit.

Figure 6:
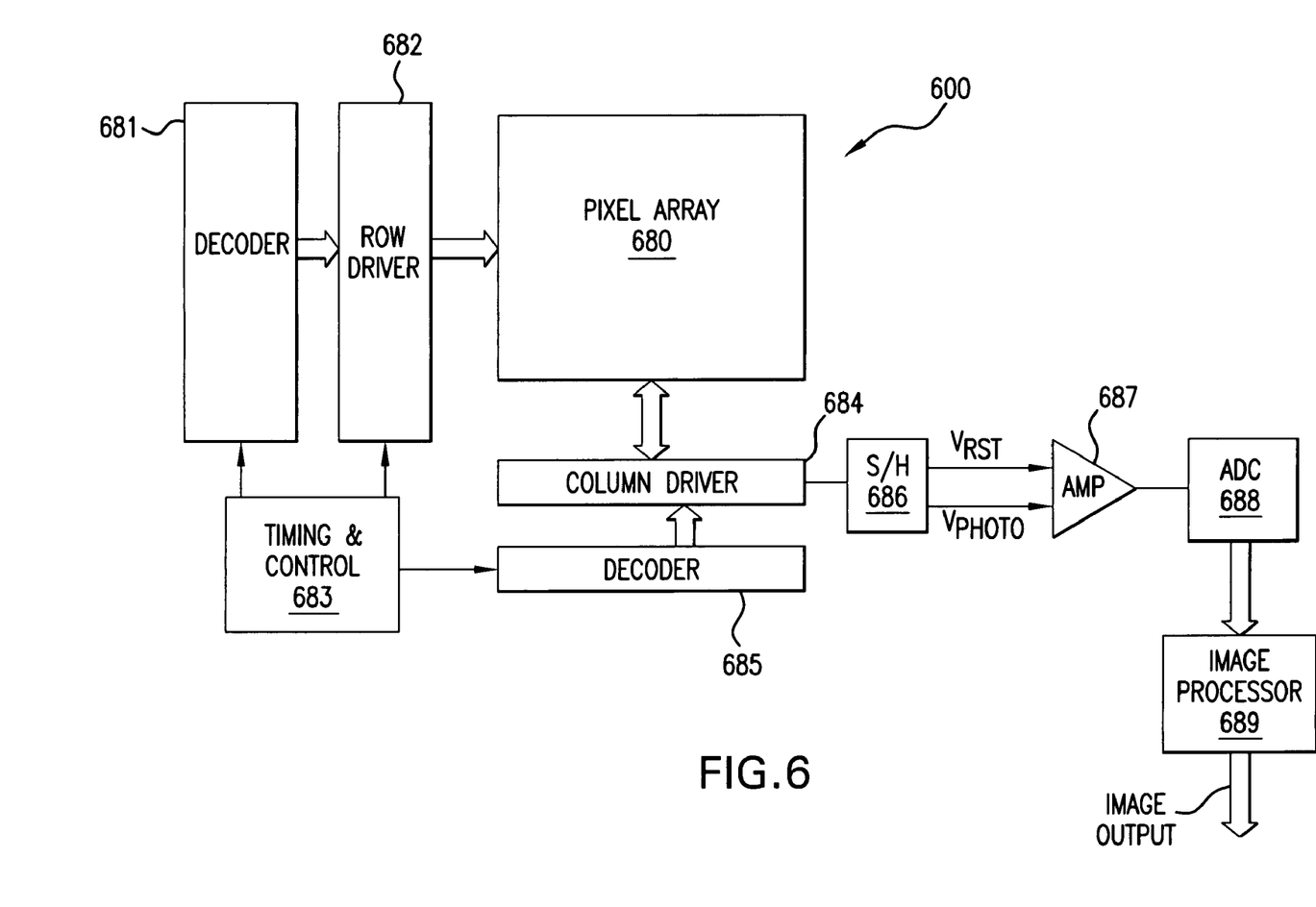
FIG. 6 is a block diagram of a CMOS image sensor according to an exemplary embodiment of the invention.

A typical single chip CMOS image sensor 600 is illustrated by the block diagram of FIG. 6. The image sensor 600 includes a pixel cell array 680 having one or more pixel cells 300 (FIG. 4) described above. The pixel cells of array 680 are arranged in a predetermined number of columns and rows.

The rows of pixel cells in array 680 are read out one by one. Accordingly, pixel cells in a row of array 680 are all selected for readout at the same time by a row select line, and each pixel cell in a selected row provides a signal representative of received light to a readout line for its column. In the array 680, each column also has a select line, and the pixel cells of each column are selectively read out in response to the column select lines.

The row lines in the array 680 are selectively activated by a row driver 682 in response to row address decoder 681. The column select lines are selectively activated by a column driver 684 in response to column address decoder 685. The array 680 is operated by the timing and control circuit 683, which controls address decoders 681, 685 for selecting the appropriate row and column lines for pixel signal readout.

The signals on the column readout lines typically include a pixel reset signal ($V_{rst}$) and a pixel image signal ($V_{photo}$) for each pixel cell. Both signals are read into a sample and hold circuit (S/H) 686 in response to the column driver 684. A differential signal ($V_{rst}-V_{photo}$) is produced by differential amplifier (AMP) 687 for each pixel cell, and each pixel cell's differential signal is digitized by analog-to-digital converter (ADC) 688. The analog-to-digital converter 688 supplies the digitized pixel signals to an image processor 689, which performs appropriate image processing before providing digital signals defining an image output. The STI region described herein may be used to isolate pixels in the array 680 or other electronic structures on the chip.

Figure 7:
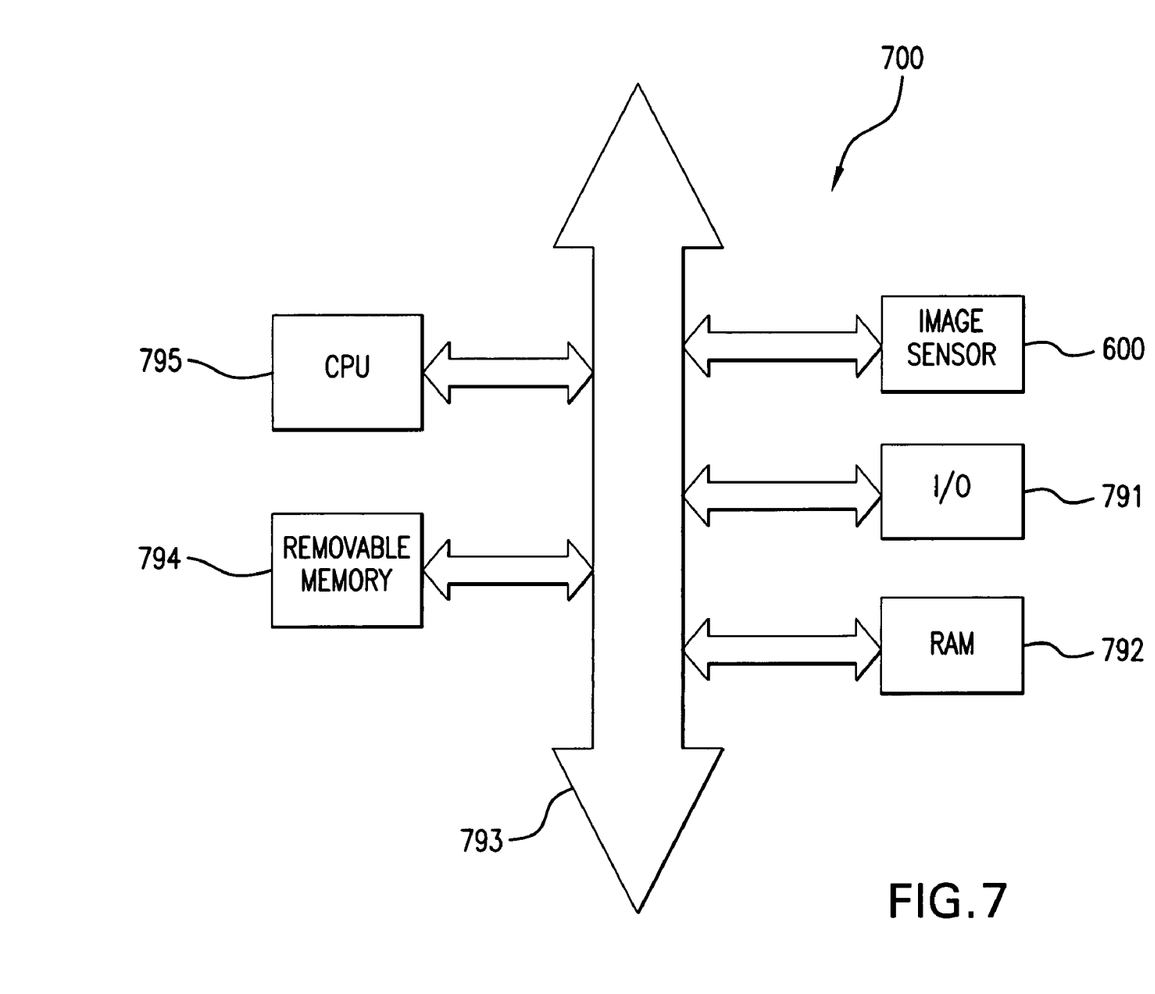
FIG. 7 is a schematic diagram of a computer processor system incorporating the CMOS image sensor of FIG. 6.

FIG. 7 illustrates a processor-based system 700 including the image sensor 600 of FIG. 6. The processor-based system 700 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, and other systems requiring image acquisition.

The processor-based system 700, for example a camera system, generally comprises a central processing unit (CPU) 795, such as a microprocessor, that communicates with an input/output (I/O) device 791 over a bus 793. Image sensor 600 also communicates with the CPU 795 over bus 793. The processor-based system 700 also includes random access memory (RAM) 792, and can include removable memory 794, such as flash memory, which also communicate with CPU 795 over the bus 793. Image sensor 600 may be combined with a processor, such as a CPU, digital signal processor, or microprocessor, with or without memory storage on a single integrated circuit or on a different chip than the processor.

Figure 8:
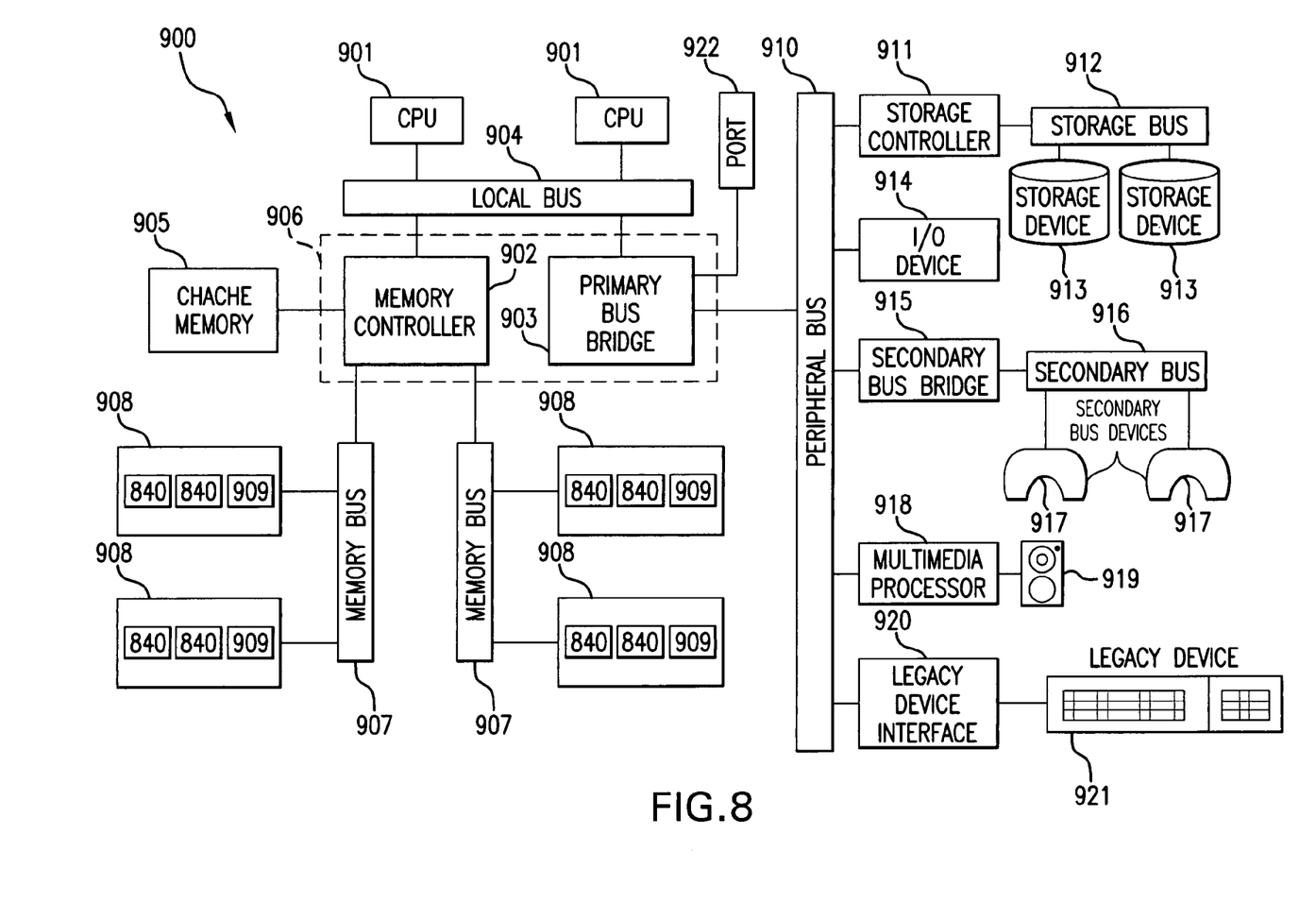
FIG. 8 is a schematic diagram of a processing system employing at least one memory cell having isolation structures constructed in accordance with the present invention.

FIG. 8 illustrates an exemplary processing system 900 that utilizes a memory device 840 containing an array of, for example, DRAM memory cells isolated as described above. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908, which include at least one memory device 840 containing the improved isolation region in accordance with the invention. Alternatively, in a simplified system, the memory controller 902 may be omitted and the memory components directly coupled to one or more processors 901. The memory components 908 may be a memory card or a memory module. The memory components 908 may include one or more additional devices 909. For example, the additional device 909 might be a configuration memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 includes peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, miscellaneous I/O device 914, a secondary bus bridge 915, a multimedia processor 918, and a legacy device interface 920. The primary bus bridge 903 may also coupled to one or more special purpose high speed ports 922. In a personal computer, for example, the special purpose port 922 might be an Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices 921, for example, older styled keyboards and mice, to the processing system 900.

The processing system 900 illustrated in FIG. 8 is only an exemplary processing system with which the invention may be used. While FIG. 8 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a processor (CPU) 901 coupled to memory components 908 and/or memory elements. The modifications may include, for example, elimination of unnecessary components, addition of specialized devices or circuits, and/or integration of a plurality of devices.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method of forming an isolation region for a semiconductor device, comprising the acts of:
   forming a trench having surfaces forming sidewalls and a bottom in a substrate;
   smoothing said surfaces of said sidewalls and said bottom by reducing a plurality of dangling atomic bonds at said surfaces, wherein the reducing act comprises applying a high temperature electric field emission to at least one of said surfaces of said trench to thereby pull silicon atoms from said substrate to said at least one of said surfaces;

oxidizing said trench having said smoothed sidewall and bottom surfaces; and filling said trench with a dielectric material.

2. The method of claim 1, wherein the reducing act comprises annealing a region including the trench in a noble gas environment.

3. The method of claim 1, wherein the reducing act comprises annealing a region including the trench in a hydrogen gas environment.

4. The method of claim 1, wherein the reducing act comprises performing anisotropic dry etching to form substantially vertical sidewalls for said trench.

5. The method of claim 4, wherein the act of filling said trench with a dielectric material comprises performing a flowable oxide process to fill said trench having vertical sidewalls with an oxide material.

6. The method of claim 1, wherein the reducing act comprises sputtering a region at least partially in said trench with an argon gas.

7. The method of claim 6, further comprising the act of annealing said region at a temperature greater than about 1000° C.

8. The method of claim 6, wherein the argon sputtering is performed with an argon beam having a current within the range of about 300 to about 800 eV.

9. The method of claim 6, wherein a rate of said sputtering is within the range of about 10 to about 310 Å/mm.

10. The method of claim 6, wherein a rate of said sputtering is within the range of about 10 to about 310 Å/mm.

11. The method of claim 1, wherein said step of reducing said dangling atomic bonds smoothes the entire surfaces of said sidewalls and said bottom.

12. A method of forming a pixel cell comprising:

forming at least one active area in a substrate; and forming an isolation region in said substrate adjacent said at least one active area by the acts of:

forming a trench having surfaces forming sidewalls and a bottom in said silicon substrate;

smoothing said surfaces of said sidewalls and said bottom by reducing a plurality of dangling atomic bonds at said surfaces, wherein the reducing act comprises applying a high temperature electric field emission to at least one of said surfaces of said trench to thereby pull silicon atoms from said substrate to said at least one of said surfaces;

oxidizing said trench having said smoothed sidewall and bottom surfaces; and filling said trench with a dielectric material.

13. The method of claim 12, wherein the reducing act comprises annealing a region including the trench in a noble gas environment.

14. The method of claim 12, wherein the reducing act comprises annealing a region including the trench in a hydrogen gas environment.

15. The method of claim 12, wherein the reducing act comprises performing anisotropic dry etching to form substantially vertical sidewalls for said trench.

16. The method of claim 15, wherein the act of filling said trench with a dielectric material comprises performing a flowable oxide process to fill said trench having vertical sidewalls with an oxide material.

17. The method of claim 12, wherein the reducing act comprises sputtering a region at least partially in said trench with an argon gas.

18. The method of claim 17, further comprising the act of annealing said region at a temperature greater than about 1000° C.

19. The method of claim 17, wherein the argon sputtering is performed with an argon beam having a current within the range of about 300 to about 800 eV.

20. The method of claim 17, wherein a rate of said sputtering is within the range of about 10 to about 310 Å/mm.

21. The method of claim 12, wherein said step of reducing said dangling atomic bonds smoothes the entire surfaces of said sidewalls and said bottom.

22. A method of forming a memory device comprising the acts of:

forming at least two active areas in a substrate; and forming an isolation region in said substrate between said two active areas, by the acts of:

forming a trench having surfaces forming sidewalls and a bottom in said substrate;

smoothing said surfaces of said sidewalls and said bottom by reducing a plurality of dangling atomic bonds at said surfaces, wherein the reducing act comprises applying a high temperature electric field emission to at least one of said surfaces of said trench to thereby pull silicon atoms from said substrate to said at least one of said surfaces; and oxidizing said trench having said smoothed sidewall and bottom surfaces; and filling said trench with a dielectric material.

23. The method of claim 22, wherein the reducing act comprises annealing a region including the trench in a noble gas environment.

24. The method of claim 22, wherein the reducing act comprises annealing a region including the trench in a hydrogen gas environment.

25. The method of claim 22, wherein the reducing act comprises performing anisotropic dry etching to form substantially vertical sidewalls for said trench.

26. The method of claim 25, wherein the act of filling said trench with a dielectric material comprises performing a flowable oxide process to fill said trench having vertical sidewalls with an oxide material.

27. The method of claim 22, wherein the reducing act comprises sputtering a region at least partially in said trench with an argon gas.

28. The method of claim 27, further comprising the act of annealing said region at a temperature greater than about 1000° C.

29. The method of claim 27, wherein the argon sputtering is performed with an argon beam having a current within the range of about 300 to about 800 eV.

30. The method of claim 22, wherein said step of reducing said dangling atomic bonds smoothes the entire surfaces of said sidewalls and said bottom.

* * * * *